(12) United States Patent
Brannon et al.

(10) Patent No.: US 10,587,025 B2
(45) Date of Patent: Mar. 10, 2020

(54) CERAMIC FILTER WITH WINDOW COUPLING

(71) Applicant: LGS INNOVATIONS LLC, Herndon, VA (US)

(72) Inventors: Alan Scott Brannon, Denver, CO (US); Jeffrey Jan Nummerdor, Jr., Rio Rancho, NM (US); Scott William Burgess, Albuquerque, NM (US)

(*) Notice: Subject to any disclaimer, the term of this patent is extended or adjusted under 35 U.S.C. 154(b) by 41 days.

(21) Appl. No.: 15/796,435

(22) Filed: Oct. 27, 2017

(65) Prior Publication Data

US 2018/0131059 A1    May 10, 2018

Related U.S. Application Data

(60) Provisional application No. 62/418,979, filed on Nov. 8, 2016.

(51) Int. Cl.

| H01P 1/213 | (2006.01) |
| H01P 1/205 | (2006.01) |
| H01P 1/08 | (2006.01) |
| H01P 5/16 | (2006.01) |
| H05K 3/34 | (2006.01) |
| H05K 1/02 | (2006.01) |
| H01P 7/04 | (2006.01) |
| H05K 1/18 | (2006.01) |
| H01P 5/02 | (2006.01) |

(52) U.S. Cl.
CPC ............ *H01P 1/2136* (2013.01); *H01P 1/08* (2013.01); *H01P 1/2056* (2013.01); *H01P 1/213* (2013.01); *H01P 5/16* (2013.01); *H01P 7/04* (2013.01); *H05K 1/0233* (2013.01); *H05K 3/3442* (2013.01); *H01P 5/024* (2013.01); *H05K 1/181* (2013.01); *H05K 2201/1006* (2013.01); *H05K 2203/048* (2013.01)

(58) Field of Classification Search
CPC ......... H01P 1/2056; H01P 1/2136; H01P 7/04
USPC ......................................... 333/134, 206, 222
See application file for complete search history.

(56) References Cited

U.S. PATENT DOCUMENTS

| 5,528,207 A | * | 6/1996 | Ito ..................... H01P 1/2056 |
| | | | 333/206 |
| 6,294,968 B1 | * | 9/2001 | Ito et al. ............. H01P 1/2053 |
| | | | 333/202 |
| 6,373,352 B1 | | 4/2002 | Lee |
| 7,898,367 B2 | | 3/2011 | Morga et al. |

(Continued)

*Primary Examiner* — Benny T Lee
(74) *Attorney, Agent, or Firm* — Baker & Hostetler LLP

(57) ABSTRACT

The present application is directed to a filter and methods of transmitting a signal through the filter. The filter includes a pair of adjoined blocks of dielectric material. A top surface of each block has a conductive patterned region. The filter also includes plural spaced apart through-holes extending through each block from the top surface to a bottom surface. The through-holes are partially surrounded by the patterned region. The filter also includes a peripheral window disposed between the adjoined blocks to permit a coupling between adjacent through-holes of the adjoined blocks. The filter also includes an in-line window and/or a crenellation located within a block of the pair of blocks and disposed between adjacent through-holes of the block to limit or tune coupling between the adjacent through-holes. The application is also directed to a system including a printed circuit board and a filter.

20 Claims, 3 Drawing Sheets

(56) References Cited

U.S. PATENT DOCUMENTS

| | | |
|---|---|---|
| 8,261,714 B2 | 9/2012 | Nummerdor |
| 8,269,579 B2 | 9/2012 | Nummerdor et al. |
| 8,294,532 B2 | 10/2012 | Nummerdor |
| 9,030,272 B2 | 5/2015 | Nummerdor |
| 2002/0047756 A1 | 4/2002 | Hershtig et al. |
| 2004/0227592 A1 | 11/2004 | Chiu et al. |
| 2005/0128031 A1 | 6/2005 | Wilber et al. |
| 2009/0146761 A1 | 6/2009 | Nummerdor |
| 2012/0326805 A1 | 12/2012 | Nummerdor |
| 2012/0326806 A1 | 12/2012 | Nummerdor |
| 2013/0038404 A1 | 2/2013 | Nummerdor |
| 2014/0077900 A1 | 3/2014 | Rogozine et al. |
| 2014/0266514 A1 | 9/2014 | Rogozine et al. |
| 2015/0295294 A1 | 10/2015 | Rogozine et al. |

\* cited by examiner

CERAMIC FILTER WITH WINDOW COUPLING

CROSS-REFERENCE TO RELATED APPLICATIONS

This application claims the benefit of priority of U.S. Provisional Application No. 62/418,979 filed Nov. 8, 2016, entitled "Ceramic Filter with Window Coupling," the content of which is incorporated by reference in its entirety herein.

FIELD

The present disclosure is generally related to ceramic filters, and more particularly, to a ceramic filter with a window coupling for adjoining one or more other ceramic filters.

BACKGROUND

Ceramic filters are used in radio equipment to reduce interference. In particular, ceramic duplex filters including two individual band-pass filters are often employed. For example, one filter connects the receiving branch and has a center frequency and bandwidth corresponding to the receiving band, while the other filter connects the transmission branch and has a center frequency and bandwidth corresponding to the transmission band.

Existing recessed top pattern (RTP) filters are large, which limits their reliable manufacture. Furthermore, such filters are architecturally limited by the requirement that the strongest bulk field couplings only occur to the next in-line resonator (without skip-resonator field couplings that would improve filter roll off). Also, such filters have undesired inter-resonator couplings due to the in-line architecture and the unconstrained fields around each resonator.

Conventional ceramic monoblock filters have resonator-to-resonator couplings limited to a straight-line path. This is due to each resonator having a strong coupling tendency primarily to its nearest neighbors within the ceramic block. This restriction to a straight-line path limits the design options for the filter. In turn, this limits the achievable filter response and the achievable small size of the filter based on the required filter response. There also exists strong undesired coupling between resonators in the straight-line path that are not adjacent. This is due to unimpeded electromagnetic fields that extend into the entire monoblock structure.

Thus, there is a need to couple resonators that are not in a straight-line path. There is a further need to permit coupling between resonators in adjacent blocks in a duplex filter, and also to prevent coupling between some resonators in the straight-line path of each block.

SUMMARY OF THE INVENTION

The foregoing needs are met, to a great extent, by the present disclosure, with an apparatus and method that permits coupling between resonators in adjacent monoblocks. The application also describes methods and apparatuses that prevent coupling between some resonators in the straight-line path. Filters designed employing these attributes exhibit the advantages of improved filter response. This is due to an increased number of transmission zeroes in the transfer function, improved removal of unwanted couplings, and greater precision.

One aspect of the present disclosure is directed to a duplex filter comprising a pair of adjoined blocks of dielectric material, each block having a top surface including a conductive patterned region, a bottom surface, and side surfaces. Plural spaced apart through-holes extend through each block from the top surface to the bottom surface, the through-holes being partially surrounded by the patterned region. A wall extends from the top surface of each block, the wall having an inner surface, an outer surface, and a rim. A peripheral window may be disposed between the adjoined blocks to limit or tune coupling between adjacent through-holes of the adjoined blocks. The peripheral window may be rectangular-shaped, square-shaped, cross-shaped, U-shaped, slit-shaped, oval-shaped, or circular shaped. Further, the peripheral window defines an opening.

In another aspect of the application, the duplex filter may also comprise an in-line window located within a block of the pair of blocks and disposed between adjacent through-holes of the block to limit or tune coupling between the adjacent through-holes. A width of the in-line window may be larger than a diameter of the adjacent through-holes. A height of the in-line window may be smaller than a longitudinal length of the adjacent through-holes. The in-line window may be rectangular-shaped, square-shaped, cross-shaped, U-shaped, slit-shaped, oval-shaped, or circular shaped.

In another aspect of the application, the duplex filter may include a crenellation on the side surface of a block of the pair of blocks to limit or tune coupling between adjacent through-holes within the block and to reduce coupling between non-adjacent through-holes within the block. A corresponding crenellation may be provided on the side surface of the other block of the pair of blocks, such that the pair of crenellations are aligned and form a hollow space therebetween. The crenellation defines a recess located on a major side surface of the block. The recess may be rectangular-shaped, square-shaped, cross-shaped, U-shaped, slit-shaped, oval-shaped, or circular shaped.

In another aspect of the application, the duplex filter may include plural peripheral windows and plural crenellations alternatingly arranged along a length of the pair of blocks. The peripheral windows and crenellations may be equidistantly spaced apart.

Another aspect of the application is directed to a system comprising a printed circuit board having a top surface and including input and output connections; and a duplex filter. The duplex filter includes a plurality of adjoined blocks of dielectric material, each block having a top surface including a conductive patterned region, a bottom surface, and side surfaces. The duplex filter further includes plural spaced apart through-holes extending through each block from the top surface to the bottom surface, the through-holes being partially surrounded by the patterned region. The duplex filter also includes a wall extending from the top surface of each block, the wall having an inner surface, an outer surface, and a rim. A peripheral window may be disposed between the adjoined blocks to permit coupling between adjacent through-holes of the adjoined blocks. Further, an in-line window may be located within a block of the pair of blocks and disposed between adjacent through-holes of the block to limit or tune coupling between the adjacent through-holes. Further, a crenellation may be provided on the side surface of a block of the pair of blocks to limit or tune coupling between adjacent through-holes within the block and to reduce coupling between non-adjacent through-holes within the block. In an aspect of the application, the duplex filter further comprises plural peripheral windows and plural crenellations alternatingly arranged along a length of a major side surface of the pair of blocks.

Another aspect of the application is directed to a method of communicating a signal to and from a node. The method comprises providing a duplex filter; receiving the signal into the duplex filter from the node; transmitting the signal between adjacent through-holes within adjoined blocks of the duplex filter by passing the signal through a peripheral window located on a major side surface of the duplex filter; and sending the signal from the duplex filter out to the node. The signal may be transmitted between adjacent through-holes within a block of the duplex filter by passing the signal through an in-line window located within the block. The signal may be transmitted between adjacent through-holes within a block of the duplex filter by passing the signal by a crenellation located on a major side surface of the block.

There has thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

BRIEF DESCRIPTION OF THE DRAWINGS

In order to facilitate a fuller understanding of the invention, reference is now made to the accompanying drawings, in which like elements are referenced with like numerals. These drawings should not be construed as limiting the invention and intended only to be illustrative.

DETAILED DESCRIPTION OF THE INVENTION

Figure 1:
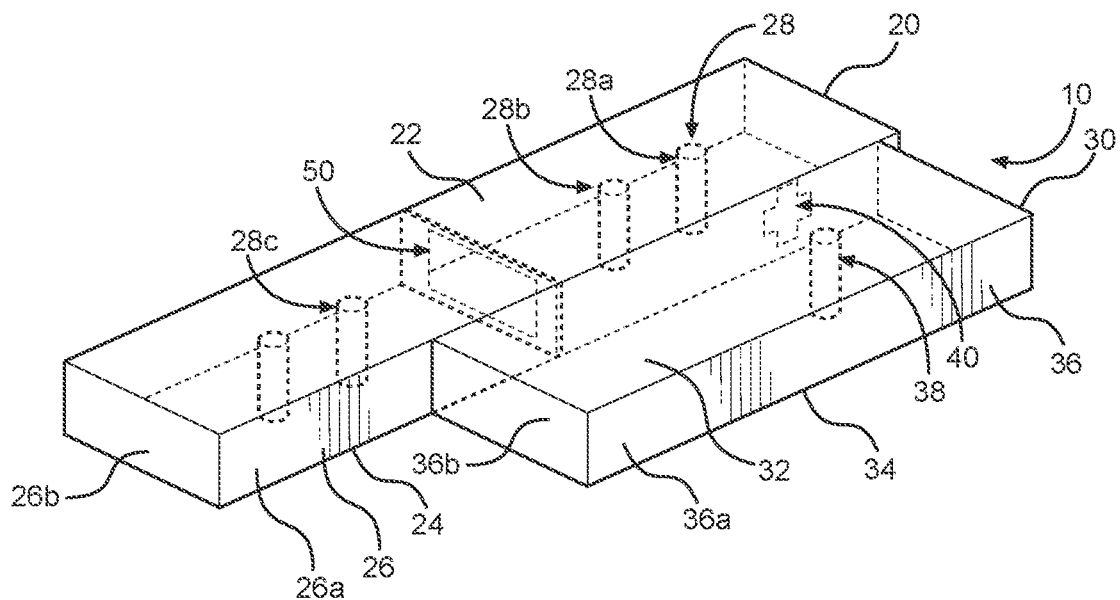
FIG. 1 illustrates a partially transparent schematic view of a duplex filter according to an aspect of the application.

In this respect, before explaining at least one embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as in the abstract, are for the purpose of description and should not be regarded as limiting.

Reference in this application to "one embodiment," "an embodiment," "one or more embodiments," or the like means that a particular feature, structure, or characteristic described in connection with the embodiment is included in at least one embodiment of the disclosure. The appearances of, for example, the phrases "an embodiment" in various places in the specification are not necessarily all referring to the same embodiment, nor are separate or alternative embodiments mutually exclusive of other embodiments. Moreover, various features are described which may be exhibited by some embodiments and not by the other. Similarly, various requirements are described which may be requirements for some embodiments but not by other embodiments.

It has been determined by the inventors and described herein that the inventive techniques provide improved ceramic filters with windows that permit resonators to be coupled to other resonators in which: 1) specific couplings can be designed for the best filter performance; 2) unwanted couplings can be largely removed; 3) the filter can be composed of smaller individual blocks that are easier to precisely manufacture; 4) and the resultant filter can be smaller due to the design and inclusion of the window couplings.

FIG. 1 illustrates a schematic view of a ceramic duplex filter 10 in accordance with an aspect of the present application. The duplex filter 10 includes a first block 20 of dielectric material and a second block 30 of dielectric material. Each block 20, 30 includes a respective top surface 22, 32 having a conductive patterned region, a bottom surface 24, 34, and side surfaces 26, 36. The respective side surfaces 26, 36 further include major side surfaces 26a, 36a and minor side surfaces 26b, 36b. The first and second blocks 20, 30 are adjoined at their respective major side surfaces 26a, 36a.

Each block 20, 30 also includes plural spaced apart through-holes 28, 38 extending through each block from the top surface 22, 32 to the bottom surface 24, 34. The through-holes are partially surrounded by the patterned region and act as resonators. Further, a wall extends from the top surface 22, 32 of each block, the wall having an inner surface, an outer surface, and a rim, as will be further discussed below.

A peripheral window 40 may be disposed between the adjoined blocks to limit or tune coupling between adjacent through-holes 28a, 38 of the adjoined blocks. The window may be configured to provide specific coupling in terms of strength and frequency response depending on the choice of window type and placement on the filter. The peripheral window 40 defines an opening, and may be rectangular-shaped, square-shaped, cross-shaped, U-shaped, slit-shaped, oval-shaped, or circular shaped, among others.

Plural peripheral windows 40 may be provided along the length of the major side surfaces of the blocks, such that each peripheral window is disposed between adjacent through-holes of the adjacent blocks. The peripheral windows 40 may be non-conductive cutouts in the metal-plated sidewalls of the ceramic filters. Moreover, depending on the choice of window type and placement on the filter, unwanted couplings can be removed, and skip-resonator filter designs may be permitted to improve filter response. The windows 40 may be formed between individual plated blocks that are connected together, such as by sintering during manufacturing. Further, during manufacturing, only one block may be formed with the precise window cut, while the adjoined block if formed having an oversized window cut in order to ensure accuracy. When windows are placed in the blocks before they are adjoined, one of the windows may be oversized to be larger than the similar (partner) window in the adjoining block. That way, when the blocks are joined, the smaller window will set the final size and position of the adjoined windows. This reduces the precision required in the alignment of the blocks during assembly, and also improves the ease and quality of manufacturing.

The duplex filter may further comprise an in-line window 50 located within a block 20 of the pair of blocks and disposed between adjacent through-holes 28b, 28c of the block 20 to limit or tune coupling between the adjacent through-holes. The width of the in-line window 50 may be larger than a diameter of the adjacent through-holes 28*b*, 28*c*. Further, a height of the in-line window 50 may be smaller than a longitudinal length of the adjacent through-holes 28*b*, 28*c*. The in-line window 50 may be rectangular-shaped, square-shaped, cross-shaped, U-shaped, slit-shaped, oval-shaped, or circular shaped, among others. Plural in-line windows 50 may be provided within one or both of the blocks of the duplexer, such that each in-line window is disposed between adjacent through-holes within the respective block.

In general, the size and shape of the peripheral and in-line windows 40, 50 affects the performance of the filter. Both the peripheral and in-line windows allow energy to pass therethrough from one resonator to another resonator. Thus, the windows 40, 50 couple energy from one resonator to another. This coupling can also affect/tune the resonant frequency of one or more nearby resonators. Therefore, a window coupling having a predetermined size and shape may be used to obtain optimal performance. For instance, a small window coupling may provide weak coupling between resonators, and a large window may provide a strong coupling between resonators.

Figure 2:
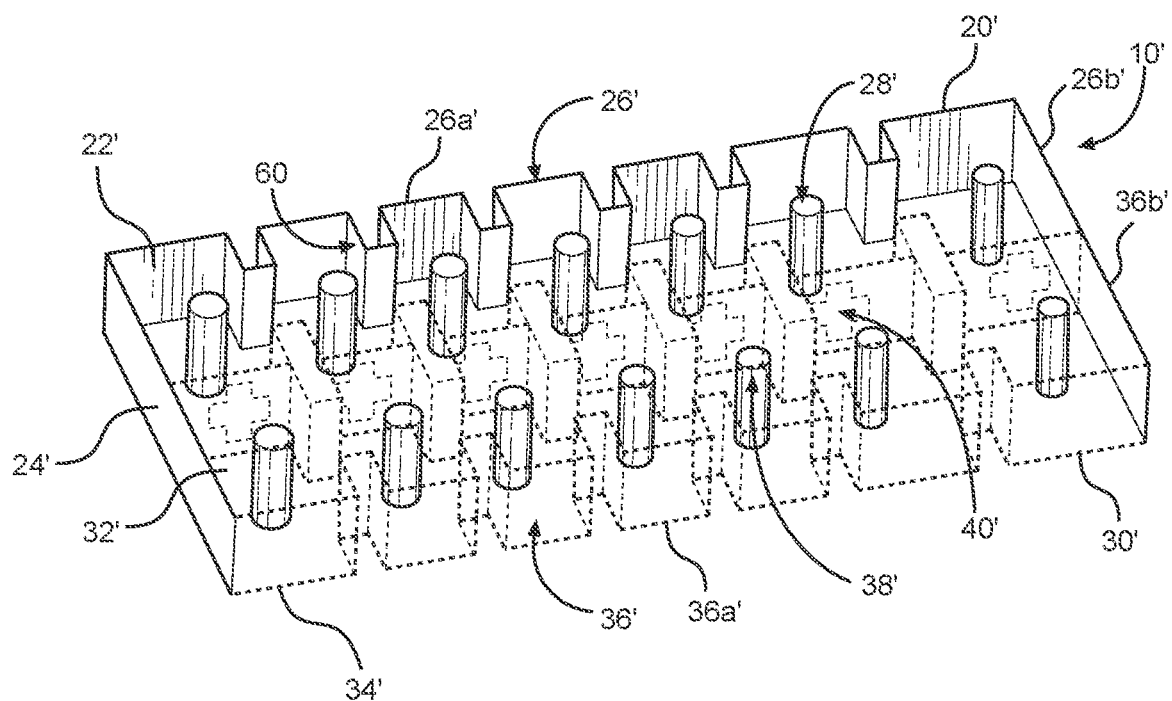
FIG. 2 illustrates a partially transparent schematic view of a duplex filter according to an aspect of the application.

Turning to FIG. 2, a schematic view of a ceramic duplex filter 10' in accordance with another aspect of the present application is illustrated. The duplex filter 10' includes a first block 20' of dielectric material and a second block 30' of dielectric material. Each block 20', 30' includes a respective top surface 22', 32' having a conductive patterned region, a bottom surface 24', 34', and side surfaces 26', 36'. The respective side surfaces 26', 36' further include major side surfaces 26*a*', 36*a*' and minor side surfaces 26*b*', 36*b*'. The first and second blocks 20', 30' are adjoined at their respective major side surfaces 26*a*', 36*a*'. Each block 20', 30' also includes plural spaced apart through-holes 28', 38' extending through each block from the top surface 22', 32' to the bottom surface 24', 34'. The through-holes are partially surrounded by the patterned region and act as resonators. Further, a wall extends from the top surface 22', 32' of each block, the wall having an inner surface, an outer surface, and a roof, as will be further discussed below.

At least one peripheral window 40' may be disposed between the adjoined blocks to limit or tune coupling between adjacent through-holes 28*a*,' 38' of the adjoined blocks. Each peripheral window 40' defines an opening, and may be rectangular-shaped, square-shaped, cross-shaped, U-shaped, slit-shaped, oval-shaped, or circular shaped, among others. The peripheral windows 40' may be provided along the length of the major side surfaces of the blocks, such that each peripheral window is disposed between adjacent through-holes of the adjacent blocks.

At least one crenellation 60 may be provided on the major side surface of a block of the pair of blocks to limit or tune coupling between adjacent through-holes within the block and to reduce coupling between non-adjacent through-holes within the block. Corresponding crenellations may further be provided on the major side surface of the other block of the pair of blocks, such that a pair of crenellations may be aligned to form a hollow space therebetween. Each crenellation 60 defines a recess located on a major side surface of the block. As further shown in FIG. 2, the ceramic duplex filter includes plural peripheral windows and plural crenellations that are alternatingly arranged along a longitudinal length of the pair of blocks. Further, the peripheral windows 40' and crenellations 60 are equidistantly spaced apart. The crenellation recess may be rectangular-shaped, square-shaped, cross-shaped, U-shaped, slit-shaped, oval-shaped, or circular shaped, among others.

Figure 3:
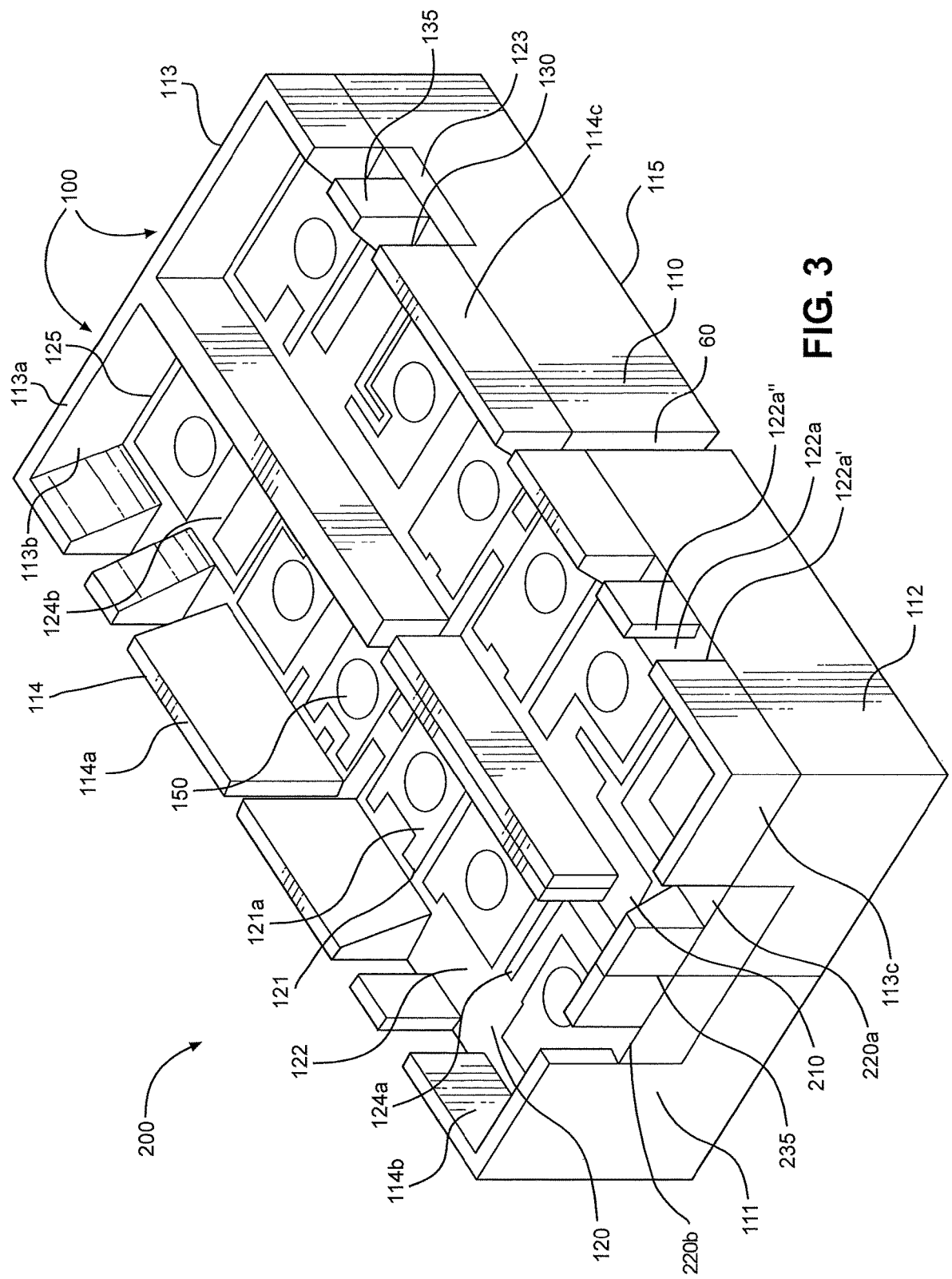
FIG. 3 illustrates a duplex filter according to an aspect of the application.

FIG. 3 illustrates a duplex filter 200 that includes two radio frequency (RF) filters 100 in accordance with an aspect of the disclosure. The duplex filter 200 may comprise at least one of the peripheral windows 40, 40' and/or at least one in-line window 50 previously described above in FIGS. 1 and 2. According another aspect, the duplex filter 200 may also, or alternatively, comprise at least one of the crenellations 60 previously described above in FIG. 2. As shown in FIG. 3, the two simplex filters are adjoined along major side surfaces 112 creating a duplex filter. In particular, in each filter 100, a slot 210 is formed in the wall 114 opposing the wall having a post 235 formed therein. Because the slot 210 is formed between two filters 100, the thickness of the slot 210 is twice the thickness of a slot 130 each filter.

In an embodiment, each of the filters 100 in the duplex filter 200 includes a slot 220*a*, 220*b* on a minor side surface 111. The post 235 is formed between the two slots 220*a*, 220*b*. In one embodiment, a portion of an inner wall of post 235 is located adjacent slot 210. A top surface of the post extends between minor side surfaces 111 of two filters. A thickness of the post may vary between the post's inner and outer walls.

Each filter 100 may be formed in any shape. In an exemplary embodiment shown in FIG. 3, each filter 100 has an elongate, parallelepiped or box-shaped rigid block or core 110 comprised of a ceramic dielectric material having a desired dielectric constant. Each filter 100 includes four side surfaces. Two of the four side surfaces are minor side surfaces 111. The other two of the four side surfaces are major side surfaces 112. Each filter 100 also includes a bottom surface 115 and a top-recessed surface 120. The top surface 120 is generally parallel and opposed to the bottom surface.

Each filter 100 also includes four generally planar walls that extend upwardly from the top surface 120. In one embodiment, the planar walls extend upwardly and/or outwardly along a perimeter of the top surface. In another embodiment, the planar walls are unitary portions of the major side surface 112 and minor side surface 111. Planar walls of the minor side surfaces are 113, and planar walls of the major side surfaces are 114. Walls 113, 114, and top surface 120 define a cavity 125. Top surfaces, or rims, 113*a* of wall 113 and top surfaces, or rims, 114*a* of wall 114 form a peripheral rim of a predetermined thickness. The thickness of the rim is dependent upon the width and length of the cavity 125.

Inner walls 113*b* of wall 113 of the minor surface 111, inner walls 114*b* of wall 114 of the major surface 112, and the top surface 120 can be plated or deposited with a first coating containing less frit content. The first coating will be described in more detail below.

In an embodiment, outer walls 113*c* and 114*c* of walls 113 and 114 are coextensive and coplanar with major side surface 112 and minor side surface 111, respectively. In one embodiment, the rims 113*a*, 114*a* are planar. In another embodiment, each rim slopes downward from the inner to outer surfaces of the respective walls 113, 114. In yet another embodiment, each rim slopes upward from the inner to outer surfaces of the respective walls 113, 114. The slopes are be envisaged to be any angle.

As shown in FIG. 3, planar wall 114 includes plural, spaced-apart slots 130. For example, the slots extend through the planar wall 114 from the inner wall 114*b* to the outer wall 114*c*. The slots 130 may have similar or different lengths extending between two minor side surfaces 111. In an embodiment, a post 135 may be formed in the planar wall 114 between two spaced-apart slots 130. The plural posts 135 may have similar or different lengths.

The top surface 120 may include plural through-holes 150. The through-holes 150 extend from the top surface 120 to the bottom surface 115 of the body 100. The through-holes 150 act as resonators. The though-holes are metallized. In an embodiment, the through-holes 150 are aligned in a spaced-apart, co-linear relationship and are also equal distances from the side surfaces. Each of through-holes 150 is defined by an inner cylindrical metallized sidewall surface. The duplex filter 200 may include at least one peripheral window 40 (FIG. 1) disposed between resonators of adjacent blocks 100 and/or at least one in-line window 50 (FIG. 1) disposed between adjacent resonators within each block 100.

Top surface 120 additionally defines a surface-layer recessed pattern of electrically conductive metallized area or pattern 121 and insulative, un-metallized area or pattern 122. The metallized areas 121 are preferably a surface layer of conductive silver-containing material. Each metallized area, or recessed pattern, 121 defines a wide area or pattern of metallization that covers the surface. In an embodiment, the recessed pattern 121, through-holes 150, and inner walls 113b, 114b are deposited with a first coating including a metal and frit. More specifically, the metal is a precious metal, such as silver (Ag).

The bottom surface 115, side surfaces 111, 112, outer planar walls 113c, 114c, and top rim 113a, 114a are deposited with a second coating including a metal and frit. The metal may be precious. In particular, the metal is silver (Ag). The frit content in the second coating may be greater than the first coating. In an embodiment, the frit content is at least 20% greater in the second coating. In an exemplary embodiment, the frit content is at least 25% greater in the second coating. In a further exemplary embodiment, the frit content is at least 30% greater in the second coating. In a yet a further exemplary embodiment, the frit content is at least 35% greater in the second coating. In even a further exemplary embodiment, the frit content is at least 40% greater in the second coating. The first coating also extends contiguously within the through-holes 150 from the top surface 120 to the bottom surface 115.

In an embodiment, a portion of metallized area 121 is present in the form of resonator pads 121a. Each of these resonator pads partially surrounds a through-hole 150 opening located on the top, recessed surface 120. In an exemplary embodiment, each resonator pad entirely surrounds one of through-holes, respectively. The resonator pads are contiguous with the metallization area 121 that extends through the inner surfaces of the through-holes. Resonator pads 121a are shaped to have predetermined capacitive couplings to adjacent resonators and other areas of surface-layer metallization.

An un-metallized area or pattern 122 extends over portions of top surface 120. Un-metallized area 122 surrounds all of the metallized resonator pads 121a. In addition, portions of inner planar walls 113b, 114b and rims 113a, 114a are un-metalized. Un-metallized area 122 extends on the top surface 120 in slot 122a (122a is representative as illustrated by the reference indicator in the drawings). The un-metallized area 122 also extends onto side wall slot portions 122a' and 122a". Side wall slot portions 122a' and 122a" define opposed sidewalls of the post 135.

In another embodiment, un-metallized area 122 also can also extend onto a portion 123 of side surface 112 located below the post 135. Portion 123 can also extend below the slots 130. These un-metallized areas co-extensive or joined or coupled with each other in an electrically non-conducting relationship.

Surface-layer pattern additionally defines a pair of isolated conductive metallized areas for input and output connections to filter 100. An input connection area or electrode 124a and an output connection area or electrode 124b are defined on top surface 120 and extend onto a portion of the planar wall 114 and side surface 112. The electrodes can serve as surface mounting conductive connection points or pads or contacts. Electrodes 124a, 124b are located adjacent and parallel to side surfaces 111. Further, each of the electrodes is located between two resonator pads 121a. Electrodes 124a, 124b are surrounded on all sides by un-metallized areas 122.

In another embodiment, the recessed top surface 120 includes metallized areas 121 and un-metallized areas 122. As a result, metallized areas are spaced apart from one another and capacitively coupled. The amount of capacitive coupling is roughly related to the size of the metallization areas and the separation distance between adjacent metallized portions as well as the overall core configuration and the dielectric constant of the core dielectric material. Similarly, top surface 120 also creates inductive coupling between the metallized areas.

Figure 4:
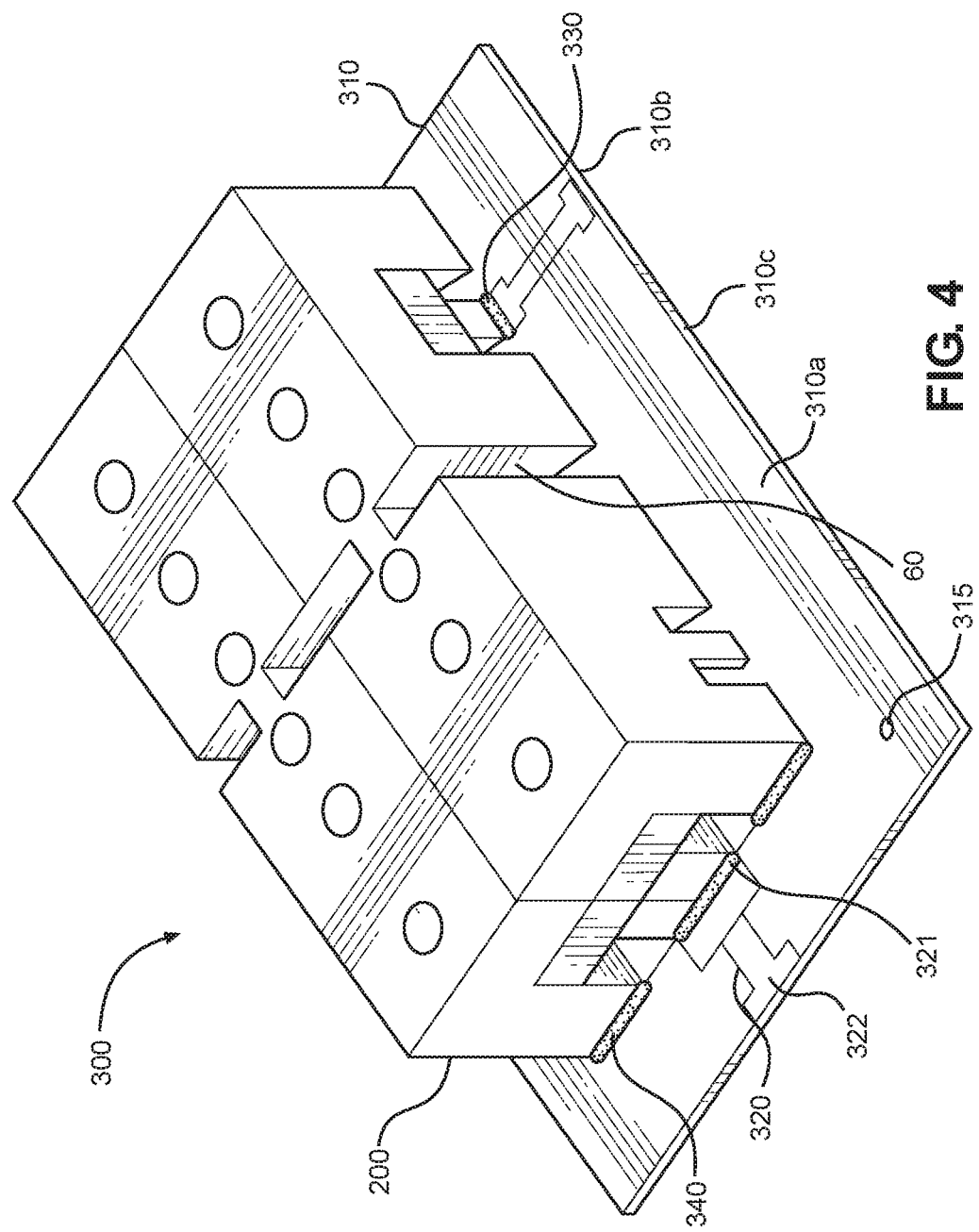
FIG. 4 illustrates a system including a duplex filter on a printed circuit board according to an aspect of the application.

According to other aspects of the disclosure, a system 300 may comprise the duplex filter 200 and a printed circuit board (PCB) 310 having a top surface and including input and output pads, as will be further described below. In other implementations, the system 300 may comprise the duplex filter 10, 10' previously described in FIGS. 1 and 2, respectively. As shown in FIG. 4, duplex filter 200 is illustrated as being mounted to a generally planar rectangular shaped circuit board 310. In one embodiment, circuit board 310 is a printed circuit board having a top or top surface 310a, bottom or bottom surface 310b and sides or side surfaces 310c. Circuit board 310 has a height of a predetermined thickness. Circuit board 310 also includes plated through-holes 315 that form an electrical connection between the top and the bottom of the circuit board 310. Several circuit lines 320 and input/output connection pads 321 can be located on top the top surface and connected with terminals 322. Circuit lines 320, connection pads 321, and terminals 322 can be formed, for example, from metal such as copper. Terminals 322 connect the duplex filter 200 with an external electrical circuit (not shown).

A post of the duplex filter 200 can be attached to the PCB 310 at the connection pad(s) 321 by solder 330. In an embodiment, one or both of the input electrode 124a and output electrode 124b (shown in FIG. 3) can be attached to the solder 330.

Circuit board 310 has a generally rectangular-shaped ground ring or line 340. It can be disposed on the top surface. The line 340 can be formed around the rim of the filter. The ground ring can be formed from copper. Next, the duplex filter 200 can be placed on top such that input electrode portion 124a and output electrode portion 124b (shown in in FIG. 3) are aligned with connection pads 321. Circuit board 310 and duplex filter 200 may be arranged in a reflow oven to melt and reflow the solders.

As illustrated in FIG. 4, duplex filter 200 is mounted to the board 310 in a top side down relationship. As a result, the top surface 120 (see also FIG. 3) is located opposite, parallel to, and spaced from the top 310 of board and the rim of 113a, 114a (see also FIG. 3) of the filter are soldered to the top of the PCB. In this relationship, cavity 125 (see also FIG. 3) is partially sealed to define an enclosure defined by the top, recessed surface 120 (see also FIG. 3), the board surface 310a, and the walls 111, 112 (see also FIG. 3) of the filter. It is further noted that, in this relationship, the through-holes in the filter are oriented in a relationship generally normal to the board 310.

The use of duplex filter 200 with recessed top surface 120 facing and opposite the board 310 provides improved grounding and off band signal absorption; and confines the electromagnetic fields within cavity 125 (FIG. 3). The arrangement also prevents external electromagnetic fields outside of cavity 125 from causing noise and interference such that the attenuation and zero points of the filter are improved. The arrangement of the cavity also prevents the electromagnetic fields from interfering and coupling with other components mounted near filter 200. The technology allows the same footprint to be used across multiple frequency bands. In addition, during solder reflow, filter 200 tends to self-align with the ground ring 340 on the circuit board. The Filter exhibits improved self-alignment since the surface tension of the liquid solder during reflow is distributed equally around roof between the ground ring and rim providing self-centering of the filter's core 110 (FIG. 3).

The use of a duplex filter 200 defining a cavity and a recessed top surface 120 facing and opposite the board eliminates the need for a separate external metal shield or other shielding as currently used to reduce spurious electromagnetic interference incurred.

Recessed pattern creates a resonant circuit that includes a capacitance and an inductance series connected to ground. The shape of the pattern determines the overall capacitance and inductance values. The capacitance and inductance values are designed to form a resonant circuit that suppresses the frequency response at frequencies outside the passband including various harmonic frequencies at integer intervals of the passband.

According to an aspect of the disclosure, a signal may be communicate to and from a node by providing a duplex filter, receiving the signal into the duplex filter from the node; transmitting the signal between adjacent through-holes within adjoined blocks of the duplex filter by passing the signal through a peripheral window located on a major side surface of the duplex filter; and sending the signal from the duplex filter out to the node. The signal may further be transmitted between adjacent through-holes within a block of the duplex filter by passing the signal through an in-line window located within the block. Additionally, or alternatively, the signal may be transmitted between adjacent through-holes within a block of the duplex filter by passing the signal by a crenellation located on a major side surface of the block.

While the apparatus, system, and method have been described in terms of what are presently considered to be specific embodiments, the disclosure need not be limited to the disclosed embodiments. It is intended to cover various modifications and similar arrangements included within the spirit and scope of the claims, the scope of which should be accorded the broadest interpretation so as to encompass all such modifications and similar structures. The present disclosure includes any and all embodiments of the following claims.

What is claimed is:

1. A duplex filter comprising:
a pair of adjoined blocks of dielectric material, each block having a respective top surface including a corresponding conductive patterned region, a respective bottom surface, and respective side surfaces;
plural spaced apart respective through-holes extending through each block from the top surface to the bottom surface, the respective through-holes being partially surrounded by the corresponding patterned region;
a respective wall extending from the top surface of each block, the respective wall having an inner surface, an outer surface, and a rim;
a peripheral window disposed between the adjoined blocks to limit or tune coupling between adjacent through-holes of the adjoined blocks; and
an in-line window located within a block of the pair of blocks and disposed between adjacent through-holes of the block to limit or tune coupling between the adjacent through-holes, a height of the in-line window is smaller than a longitudinal length of the adjacent through-holes.

2. The duplex filter according to claim 1, wherein the peripheral window is rectangular-shaped, square-shaped, cross-shaped, U-shaped, slit-shaped, oval-shaped, or circular shaped.

3. The duplex filter according to claim 1, wherein a width of the in-line window is larger than a diameter of the adjacent through-holes.

4. The duplex filter according to claim 1, wherein the peripheral window defines an opening.

5. The duplex filter according to claim 1, wherein the in-line window is rectangular-shaped, square-shaped, cross-shaped, U-shaped, slit-shaped, oval-shaped, or circular shaped.

6. The duplex filter according to claim 1, further comprising a crenellation on each side surface of a block of the pair of blocks to limit or tune coupling between adjacent through-holes within the block and to reduce coupling between non-adjacent through-holes within the block.

7. The duplex filter according to claim 6, further comprising a corresponding crenellation on each side surface of the other block of the pair of blocks, such that a pair of crenellations are aligned and form a hollow space therebetween.

8. The duplex filter according to claim 6, wherein the crenellation defines a recess located on a major side surface of the block.

9. The duplex filter according to claim 8, further comprising additional peripheral windows and additional crenellations alternatingly arranged along a length of the pair of blocks.

10. The duplex filter according to claim 9, wherein adjacent peripheral windows and crenellations are equidistantly spaced apart.

11. The duplex filter according to claim 8, wherein the recess is rectangular-shaped, square-shaped, cross-shaped, U-shaped, slit-shaped, oval-shaped, or circular shaped.

12. A method of communicating a signal to and from a node, the method comprising:
providing the duplex filter according to claim 1;
receiving the signal into the duplex filter from the node;
transmitting the signal between adjacent through-holes within the adjoined blocks of the duplex filter by passing the signal through the peripheral window located on a major side surface of the duplex filter; and
sending the signal from the duplex filter out to the node.

13. The method of communicating a signal to and from a node according to claim 12, further comprising transmitting the signal between adjacent through-holes within a block of the pair of adjoined blocks by passing the signal through an in-line window located within the block.

14. The method of communicating a signal to and from a node according to claim 12, further comprising transmitting the signal between adjacent through-holes within a block of the pair of adjoined blocks by passing the signal by a crenellation located on a major side surface of the block.

15. A system comprising:
    a printed circuit board having a top surface and including input and output pads; and a duplex filter including:
    a pair of adjoined blocks of dielectric material, each block having a respective top surface including a corresponding conductive patterned region, a respective bottom surface, and respective side surfaces;
    plural spaced apart respective through-holes extending through each block from the top surface to the bottom surface, the respective through-holes being partially surrounded by the corresponding patterned region;
    a respective wall extending from the top surface of each block, the respective wall having an inner surface, an outer surface, and a rim;
    a peripheral window disposed between the adjoined blocks to limit or tune coupling between adjacent through-holes of the adjoined blocks; and
    an in-line window located within a block of the pair of blocks and disposed between adjacent through-holes of the block to limit or tune coupling between the adjacent through-holes, a height of the in-line window is smaller than a longitudinal length of the adjacent through-holes.

16. The system according to claim 15, wherein the duplex filter further comprises a crenellation on each side surface of a block of the pair of blocks to limit or tune coupling between adjacent through-holes within the block and to reduce coupling between non-adjacent through-holes within the block.

17. The system according to claim 16, wherein the duplex filter further comprises additional peripheral windows and additional crenellations alternatingly arranged along a length of a major side surface of the pair of blocks.

18. The system according to claim 16, further comprising a corresponding crenellation on each side surface of the other block of the pair of blocks, such that a pair of crenellations are aligned and form a hollow space therebetween.

19. The system according to claim 16, wherein the crenellation defines a recess located on a major side surface of the block.

20. The system according to claim 15, wherein a width of the in-line window is larger than a diameter of the adjacent through-holes.

* * * * *